United States Patent [19]

Roger et al.

[11] 4,013,337
[45] Mar. 22, 1977

[54] CONNECTION LUGS IN THE FORM OF A COMB FOR POWER TRANSISTORS

[75] Inventors: Bernard Roger, Carpiquet; Michel Ayel, Evrecy; Francis Debar, Thaon, all of France

[73] Assignee: U.S. Philips Corporation, New York, N.Y.

[22] Filed: June 26, 1975

[21] Appl. No.: 590,439

[30] Foreign Application Priority Data

July 8, 1974 France .............................. 74.23644

[52] U.S. Cl. .............................. 339/258 R; 357/79
[51] Int. Cl.² ........................................ H01R 13/12
[58] Field of Search ..................... 339/17, 258, 125; 357/79; 58/23 R, 23 BA, 50 R

[56] References Cited

UNITED STATES PATENTS

| | | | |
|---|---|---|---|
| 2,830,698 | 4/1958 | Coda et al. ....................... | 339/17 C |
| 2,985,704 | 5/1961 | Kempf et al. .................... | 58/23 BA |
| 2,985,705 | 5/1961 | Smythe ............................ | 58/23 BA |
| 3,500,136 | 3/1970 | Fischer ............................ | 357/79 |
| 3,916,433 | 10/1975 | Schierz ............................ | 357/79 |

*Primary Examiner*—Joseph H. McGlynn
*Attorney, Agent, or Firm*—Frank R. Trifari; Ronald L. Drumheller

[57] ABSTRACT

A connection lug comb configuration for power semiconductor devices wherein bent lugs are drawn toward the semiconductor body resting on a heat sink base by pins having heads that engage slots in the lugs.

3 Claims, 4 Drawing Figures

CONNECTION LUGS IN THE FORM OF A COMB FOR POWER TRANSISTORS

The present invention relates to connection lugs in the form of a comb to facilitate mechanized assembly of power semiconductor devices and comprises at least a straight portion cut out of a metal strip and a plurality of identical strip patterns constituting connection lugs for the devices, the crystal of each device being mounted on a base traversed by rigid insulated conductors connected electrically by the strips to various regions on the crystal.

It is known that in the case of low-power semiconductor devices, notably transistors, mechanization of the electrochemical treatments and of the mounting has already been improved by using means which comprise a plurality of identical metallic strip patterns each comprising a part supporting the semiconductor crystal and connection lugs, the connection means being cut in suitable places after completion of the semiconductor devices so as to separate them from each other and to eliminate the parts of the connection means which have become useless or troublesome.

Such a collective connection means obtained by photoengraving and chemical attack or by mechanically cutting a metal tape of a small thickness may have several shapes. However, in the simplest and most frequently used shapes the connection lugs are substantially parallel to each other, which is why the connection means are generally called "combs".

It is also known that up till now it has not been possible to adapt such combs to the manufacture of high power transistors. Actually, taking into account the dimensions and the characteristics of such transistor types, the semiconductor crystals from which they are manufactured cannot be soldered directly to a connection lug of a comb but must be soldered to a piece having a good thermal conductivity.

Generally, the current flowing in the power transistors is of the order of several amperes and even several tens of amperes and the power to be dissipated may be as much as a few hundred watts. Consequently, the piece having a good thermal conductivity is usually made of a metal which is a good heat conductor, for example copper, or even a ceramic material having a large content of alumina or berylia and it has comparatively large dimensions. Therefore the piece having a good thermal conductivity generally forms part of a base which also has large dimensions, for example of the type known as "TO3" and "SOT 3".

This type of base comprises at least two conductors traversing the piece supporting the crystal and insulated from the piece by two glass beads.

With regard to the crystal it is known that, in order to be able to pass large currents and to permit the flow of thermal flux resulting from the operation of the transistor, the crystal must also have comparatively large dimensions. For the same reasons, the connection lugs which electrically connect the contact pads of the crystal to the output conductors must be large.

Consequently, up till now the connection lugs during assembly have been provided only as a tight fit on each of the conductors, which aids in holding them in place. In addition, the pressure exerted on the crystal by the lugs should maintain the crystal immovable before soldering. This operation of putting the connection lugs in place is hence an operation which is still effected manually, and, up till now, it has been impossible to make it mechanical and automatic.

Consequently, the operation remains comparatively expensive and appreciably affects the cost-price of a finished transistor.

It is the object of the present invention to mitigate the above-mentioned drawbacks and to permit mechanized assembly of power devices.

According to the invention, the connection lugs in the form of a comb facilitate mechanized assembly of power semiconductor devices and comprise at least a straight portion cut out of a metallic strip and a plurality of identical strip patterns constituting connection lugs for the devices, the crystal of each device being mounted on a base traversed by rigid insulated conductors connected electrically by the strips to various regions on the crystal. Each strip pattern is formed integrally with a longitudinal frame that is lengthwise bent into a Z-shaped to support the strips above the base from one of their ends. Each strip comprises a slot for cooperation with a rigid conductor to ensure a correct relative positioning of the connection strip with respect to the rigid conductor.

Since utilization of such connection lugs in the form of a comb is made possible for power semiconductor devices, it permits mechanized assembly of the latter. Consequently, mechanization and automation of the manufacture of the devices reduces the assembly time and also reduces the risk of errors from numerous manipulations.

The connection lugs according to the invention may be obtained either by mechanical cutting, or by cutting by photoengraving and chemical attack.

The mechanical cutting is utilized preferably when the connection lugs are composed or rectilinear elements and/or when they are of large dimensions and when the tolerances on the dimensions remain comparatively large.

On the other hand, the cutting by photoengraving is used in particular when the connection lugs constitute a compact assembly and comprise notably incurved elements.

Preferably, the rigid conductors traversing the base of the device comprise at their extremity near the semiconductor crystal a widening on which the connection strips of each pattern engage.

Advantageously, said widening constitutes a circular pad giving the extremity of each rigid conductor a configuration in the form of a nailhead.

Actually, the configuration in the form of a nailhead becomes a vertical abutment for the lugs when the lugs are engaged on the conductors. With these conditions, and with the correct choice of dimensions for the lugs and the Z-shaped frame it is possible to give the lugs a spring effect which maintains the crystals in place before being soldered to the base.

In a first embodiment the axis of the slots is perpendicular to the longitudinal direction of the frame of the comb.

When the bases are thus disposed in a single continuous row on a suitable platform in such manner that all the rigid conductors are disposed on a straight line parallel to the frame of the comb, it is possible in a single operation to engage the slots of the strips on the corresponding conductors.

In a second embodiment the axis of the slots is parallel to the longitudinal direction of the frame of the comb.

In certain configurations of the comb, if the slots of the strips are perpendicular to the direction of the frame, it is possible to have a spring effect and a reaction effect of the strips which leads to a slight backward movement of the whole comb. In this case, the extremities of the strips are no longer disposed in the desired contact places on the crystal. Therefore it is preferable in such cases to dispose the slots laterally so as to avoid a backward movement of the comb.

From the following description with reference to the accompanying drawing it will be well understood how the invention can be realized.

It will be obvious that the lugs of the same pattern may have forms different from those shown and different from each other, all the patterns of the same comb, however, remaining identical.

Figure 1:
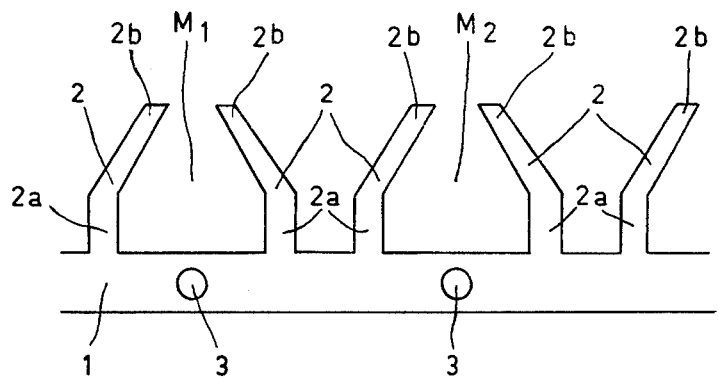
FIG. 1 is a partial diagrammatic underneath view of connection lugs in the form of a comb according to the invention of which each pattern comprises two convergent strips for power transistors.

The comb according to the invention shown in FIG. 1 comprises a number of identical patterns of which only the patterns $M_1$ and $M_2$ are shown completely. Each pattern comprises a longitudinal frame 1 which supports strips 2 that form connection lugs of which the extremity 2a is to be fixed to a rigid output conductor and extremity 2b is to be soldered to a contact place on a semiconductor crystal not shown. Each pattern is connected to the next one by the longitudinal frame 1 which thus forms a large strip in which holes 3 are provided for utilization by automatic machines that fix and move the patterns of the comb.

Figure 2:
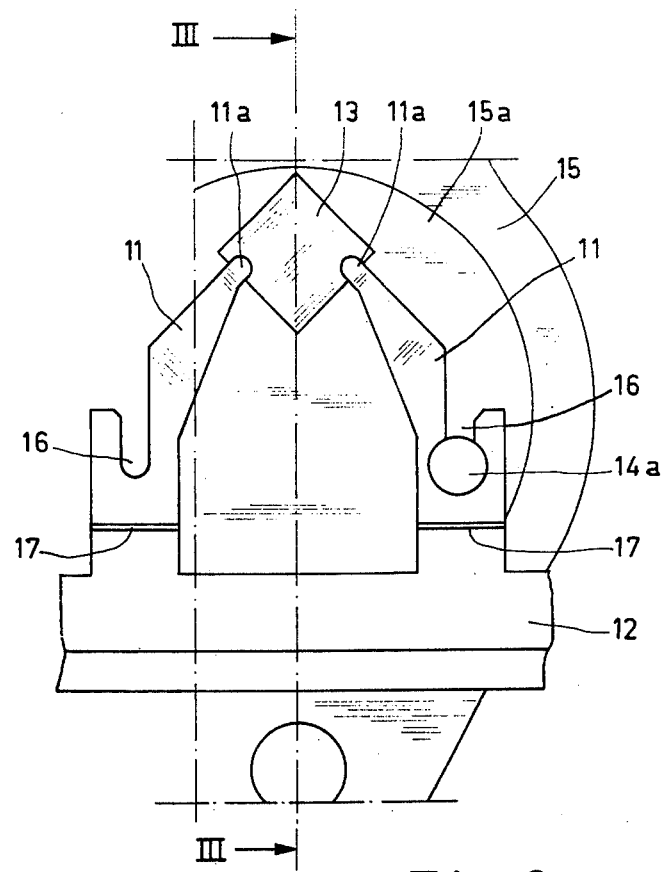
FIG. 2 is a partial underneath view of a first embodiment of a pattern according to the invention comprising two convergent connection lugs.
Figure 3:
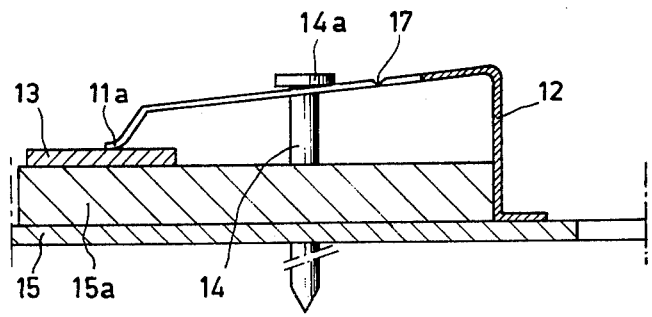
FIG. 3 is a cross-sectional view taken on the line III—III of FIG. 2 of the same pattern according to the invention.

FIGS. 2 and 3 show in greater detail a first embodiment of a pattern according to the invention.

As shown in FIGS. 2 and 3, each pattern comprises two strips 11 which are substantially identical and symmetrical with respect to the axis of the pattern, strips 11 being formed integrally with the longitudinal frame 12 and being destined to form connection lugs between contact places on the semiconductor crystal 13 and rigid conductors 14 traversing the base 15 supporting the crystal 13 (FIG. 2).

Each pattern has for its object not only to constitute connection lugs but also to maintain the crystal 13 in place before it is soldered to the base 15. Therefore the longitudinal frame 12 of the comb has a Z-shape (FIG. 3) to permit the comb to be forced against a platform 15a of the base 15. In addition, each strip 11 comprises a slot 16 to permit the strip to be held in place below the widened heads 14a'' of the conductors 14. In this embodiment, the axis of the slot is parallel to the large axis of the base 15, and perpendicular to the longitudinal direction of the frame of the comb. Each strip 11 also comprises a rectilinear groove 17 constituting a fracture place to remove the frame 12 when the strips 11 are fixed definitively.

Hence, to position the comb, each pattern is slid on the edge of the base 15 until the rigid conductors 14 are at the bottom of the slots 16 and the frame 12 abuts against the platform 15a of the base 15. The heads 14a bear on the strips 11 to push them downward, the strips 11 having a suitable elasticity due to the choice of utilized material. The elasticity of the strips 11 is used to temporarily maintain the crystal 13 in place on the platform 15a.

By means of a tool not shown in the figure, the extremity 11a of the strips 11 is lifted in such manner that crystal 13 can be slid below the strips, the crystal being disposed in a suitable slot cut in the tool and utilized to define the position of the crystal. When the crystal 13 is in its place, the tool is removed and this removal permits the extremities 11a of the strips 11 to bear on the crystal 13 which is thus maintained on the platform 15a until it is soldered to the platform by passage through a furnace.

Figure 4:
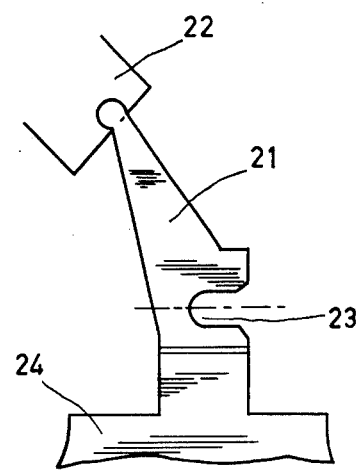
FIG. 4 shows a part of a pattern according to the invention comprising one lug obtained according to a second embodiment.

FIG. 4 shows a second embodiment of the connection lugs 21 connecting the crystal 22 to the rigid output conductors not shown in the figure.

According to this embodiment, the axis of the slots 23 is parallel to the direction of the longitudinal frame 24 of the comb. The object of this embodiment is to avoid a backward movement of the comb under the effect of the pressure exerted on the strips 21 by the heads 14a situated at the extremity of the rigid conductors 14.

We claim:

1. A connection lug assembly for power semiconductor devices, comprising:
    a generally planar base;
    a generally planar platform on said base for supporting a semiconductor crystal, said platform having a side surface in upstanding relationship with said base;
    a frame strip bent longitudinally into a Z-shape to abut said base and side surface of said platform and to overhang said platform;
    connection strips integrally formed with said frame strip and supported from one end thereby over said platform, said connection strips each having a slot;
    a rigid conductor corresponding to and received by each slot, said conductors being disposed generally perpendicular to said base and having widened heads for cooperation with said slots to press said connection strips toward said platform for contacting predetermined places on the semiconductor crystal and for holding the crystal in place until soldering.

2. A connection lug assembly as defined in claim 1 wherein said slots are oriented perpendicular to the longitudinal direction of said frame strip.

3. A connection lug assembly as defined in claim 1 wherein said slots are oriented parallel to the longitudinal direction of said frame strip.

* * * * *